United States Patent [19]
Olson et al.

[11] Patent Number: 5,451,937
[45] Date of Patent: Sep. 19, 1995

[54] UNIVERSAL GENERATOR INTERFACE MODULE

[75] Inventors: John A. Olson; Donald H. Strobel, both of Brookfield; Walter L. Probert, Glendale, all of Wis.

[73] Assignee: Badger Meter, Inc., Milwaukee, Wis.

[21] Appl. No.: 107,403

[22] Filed: Aug. 16, 1993

[51] Int. Cl.$^6$ .............................................. H04Q 1/00
[52] U.S. Cl. ........................... 340/870.3; 340/870.02; 379/107; 327/100; 327/291
[58] Field of Search ............. 340/870.02, 870.21, 340/870.18, 870.26, 870.25, 870.3, 870.31; 328/13; 341/157; 307/261; 348/572; 379/107

[56] References Cited

U.S. PATENT DOCUMENTS

| | | | |
|---|---|---|---|
| 4,728,815 | 3/1988 | Main | 307/261 |
| 4,839,788 | 6/1989 | Tullsen | 328/13 |
| 4,868,566 | 9/1989 | Strobel et al. | 340/870.3 |
| 5,031,209 | 7/1991 | Thornborough et al. | 379/107 |
| 5,283,572 | 2/1994 | McClelland et al. | 340/870.02 |

Primary Examiner—James J. Groody
Assistant Examiner—Glenton B. Burgess
Attorney, Agent, or Firm—Quarles & Brady

[57] ABSTRACT

A module for interfacing a variety of metering pulse generators converts an analog pulse from a generator into a digital pulse which can be counted by automatic meter reading equipment. A charging circuit is connected across the inputs to receive, and be charged by, an input waveform from the metering pulse generator. A solid state switch responds to accumulated charge in the charging circuit to switch from an "off" state to an "on" state. A logic pulse generator is connected between the solid state switch and the outputs, for physical and electrical isolation of the metering pulse generator from the pulse counter. The logic pulse generator responds to the "on" state of the solid state switch to generate a logic pulse to the pulse counter.

8 Claims, 2 Drawing Sheets

UNIVERSAL GENERATOR INTERFACE MODULE

BACKGROUND OF THE INVENTION

1. Field of the Invention

The invention relates to metering equipment, and more particularly equipment and methods for metering consumption of utilities, such as electricity, gas and water.

2. Description of Prior Art

Strobel et al., U.S. Pat. No. 4,868,566, discloses a metering pulse generator which is operated by the turning of a metering cam in response to the flow of water. This device produces a pulse that is transmitted to an automatic meter reading (AMR) unit of the type disclosed in Thornborough et al., U.S. Pat. No. 5,031,209. The accumulated signals are transmitted from the AMR unit to a utility collection center via telephone lines.

In the meter reading industry, other types of pulse generators have been used to produce various types of pulses for incrementing an electromechanical register. These devices produce a sinusoidal pulse to indicate an incremental amount of consumption.

In the past, the metering pulse generator has been designed for use with other parts of the metering equipment at the customer site, such as electromechanical registers. There is currently a trend toward more extensive remote meter reading systems for serving large areas. This has resulted in a need for improved interchangeability between components of meter reading systems to allow a combination of components from different suppliers in a meter collection system for a large service area.

Currently, there are no industry-wide standards for the output of metering pulse generators. The signal output from different metering pulse generators differs in polarity, amplitude, duration, frequency, and number of cycles.

SUMMARY OF THE INVENTION

The invention relates to a universal interface module for interfacing metering pulse generators to other equipment.

Generally, the invention converts an analog signal from a generator into a digital format used by automatic meter reading (AMR) equipment. The device uses the energy from a generator pulse to produce an open collector output of specific time duration.

A first embodiment of the invention more particularly includes inputs for receiving a varying sinusoidal waveform from a metering pulse generator and further includes outputs for transmitting an individual output pulse to a pulse counter.

A charging circuit is connected across the inputs to receive, and be charged by, one or more lobes of a sinusoidal generator pulse from the metering pulse generator. A solid state switch responds to accumulated charge in the charging circuit to switch from an "off" state to an "on" state. A logic pulse generator is connected between the solid state switch and the outputs, for physical and electrical isolation of the metering pulse generator from the pulse counter. The logic pulse generator responds to the "on" state of the solid state switch to generate a logic pulse to the pulse counter.

One object of the present invention is to make a range of pulse generator units compatible with data acquisition systems such as electronic automatic meter reading (AMR) equipment. This includes pulse generator units that transmit a single pulse in the form of a sinusoidal waveform with one or more lobes or cycles. Depending on the unit, the waveform may be different from the waveform of other units in polarity, amplitude, duration, frequency, and number of cycles.

Another object of the invention is to produce an individual output pulse of controlled time duration in response to multiple cycles of an input signal.

Another object of the invention is to maintain either digital or analog lead line supervision between the universal interface and the automatic meter reading equipment.

Another object of the invention is to create the output pulse solely from the energy from the generator waveform.

Other objects and advantages, besides those discussed above, will be apparent from the description of the preferred embodiment, which follows. In the description, reference is made to the accompanying drawings, which form a part hereof, and which illustrate examples of the invention. Such examples, however, are not exhaustive of the various embodiments of the invention, and, therefore, reference is made to the claims which follow the description for determining the scope of the invention.

DETAILED DESCRIPTION OF THE PREFERRED EMBODIMENTS

Figure 1:
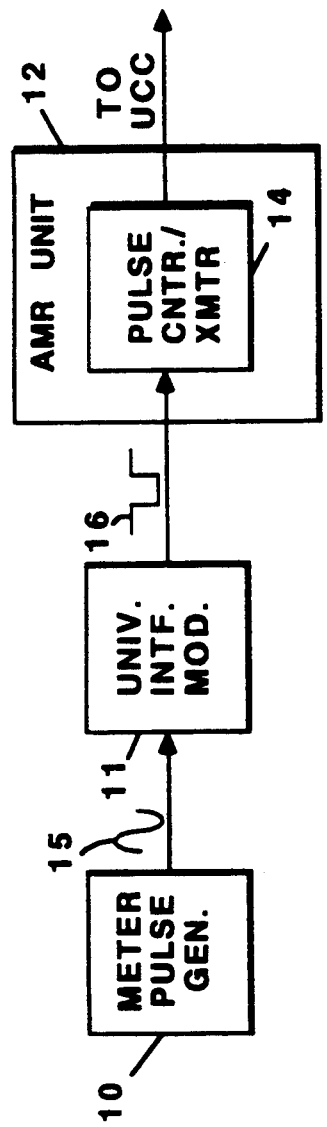
FIG. 1 is a block diagram showing the environment of the present invention.

Referring to FIG. 1, the present invention is represented by block 11 as a universal interface module. The module 11 receives a sinusoidal signal 15 and converts this signal to an electrical output pulse 16. The output pulse 16 is coupled to a pulse counter/transmitter 14 in an automatic meter reader (AMR) device 12 located at a customer site. The transmitter 14 sends meter data signals to a utility control center (UCC) (not shown). Pulse counting and transmitting circuitry 14, of the type just mentioned, but without module 11, is disclosed in Thornborough et al., U.S. Pat. No. 5,031,209.

Figure 2:
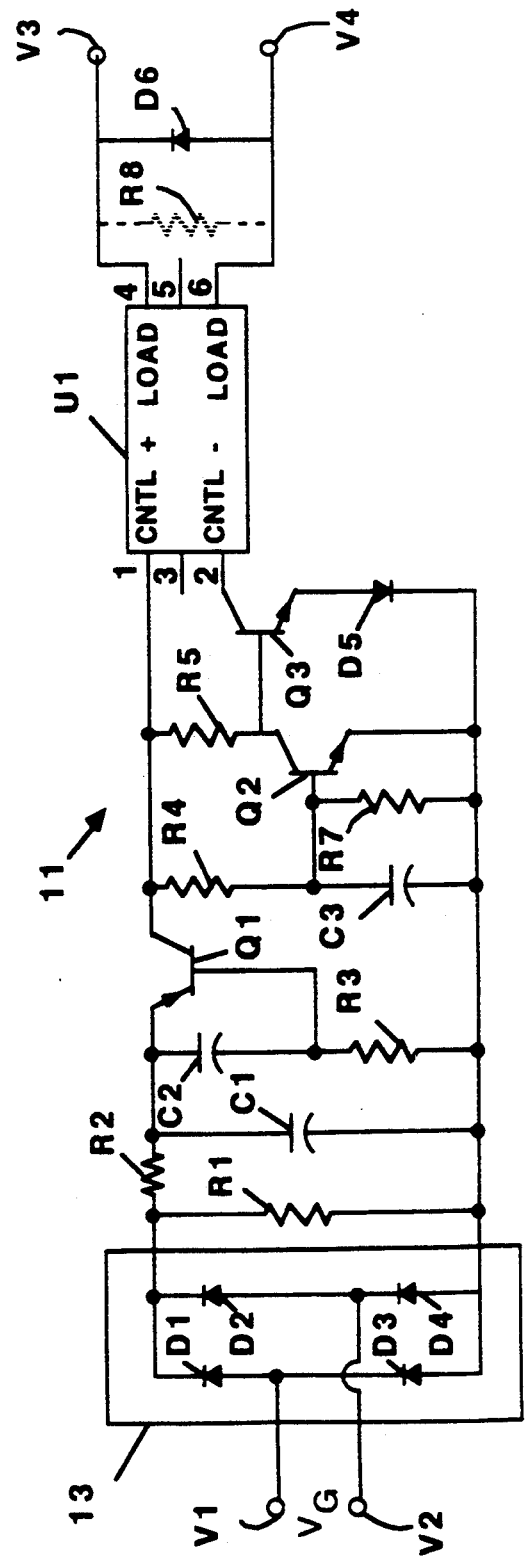
FIG. 2 is a schematic of a circuit for practicing the invention.

As seen in FIG. 2, the module more particularly includes a circuit 11 formed on a circuit board (not shown) including a full-wave rectifying diode bridge 13 with diodes D1-D4 connected across input terminals V1 and V2. The bridge 13 allows the generator input $V_G$ to be connected regardless of polarity. Generator 10 generates a pulse that corresponds to one unit of flow measurement.

A capacitor C1 is connected in parallel with a resistor R1 across the output of the bridge 13. Resistor R2 is connected in series between resistor R1 and capacitor C1 to provide a means for discharging capacitor C1. Capacitor C1 is charged by the energy from the pulse from generator 10. In parallel with capacitor C1 is an R-C series circuit of C2 and R3. PNP Transistor Q1 has its emitter connected to the positive plate of capacitor C2 and its base connected to the negative plate of capacitor C2. The collector output is connected to resistor R4.

As C1 charges, the C2/R3 R-C circuit causes a delay in the turn-on of the Q1 transistor. The delay assures that C1 has sufficient charge to produce a suitable output pulse. The delay is necessary for generator pulses with slow rise times and relatively weak amplitudes. The combination of the bridge diode voltage drops and delays caused by C1, R2, C2, and R3 provides noise immunity and a filtering response to lobes of the sinusoidal generator pulse prior to the main lobe. Filtering also provides a smoothing response for generators with higher frequency sinusoids.

An R-C circuit comprising resistor R4 and capacitor C3 is connected between the collector of Q1 and a return line. A resistor R7 is connected parallel to capacitor C3. The high side of capacitor C3 and resistor R7 are connected across the base-emitter junction of transistor Q2. The collector output of Q2 is connected through resistor R5 and is also connected to the base of NPN transistor Q3. Diode D5 has an anode connected to emitter of Q3 and cathode connected to the return line.

When C2 charges to a sufficient level, the Q1 transistor turns on. This further turns on transistor Q3 to transfer voltage and current to solid state relay U1. This begins the output pulse from pins 4 and 6 of relay U1. The duration of the pulse is controlled by R4, C3, and R7. The end of the output pulse occurs when C3 charges to a level that turns on the Q2 transistor. When Q2 turns on, Q3 is turned off to remove the current flow through U1.

The D5 diode and diode characteristic response of U1 produce a stable voltage at the collector of Q1. The stable collector voltage is not dependent on the input voltage because of the current limiting through R2. This provides a consistent timing response in the charging of C3. When Q2 is turned "on" to end the output pulse, C3 maintains the "on" state of transistor Q2 until after the completion of the generator pulse. The continuing "on" state of Q2 provides immunity from secondary lobes of the generator pulse, such that only one output pulse is produced by the input generator waveform. Residual charge on C1 is bled through R2.

The U1 solid state relay provides physical and electrical isolation between the generator 10 and automatic meter reading device 12. With diode D6 connected across the LOAD terminals, the relay output has the characteristic of an open-collector drive transistor. This enables the AMR device 12 to sense lead line supervision in a digital manner. For further information on interface to the lead line circuit, reference is made to Thornborough et al., U.S. Pat. No. 5,031,209. The AMR device 12 may also be operated in an analog manner for sensing lead line supervision. A resistor R8 is connected in addition to diode D6 across the LOAD output terminals of the solid state relay U1 for this purpose.

Figure 3A:
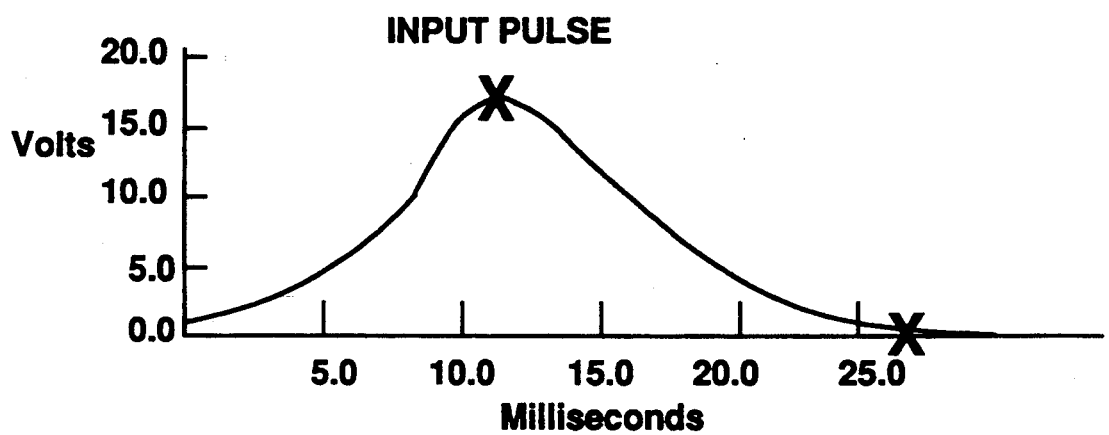
FIGS. 3a and 3b are graphs of voltage vs. time for the operation of the circuit of FIG. 2 with a first metering pulse generator.
Figure 3B:
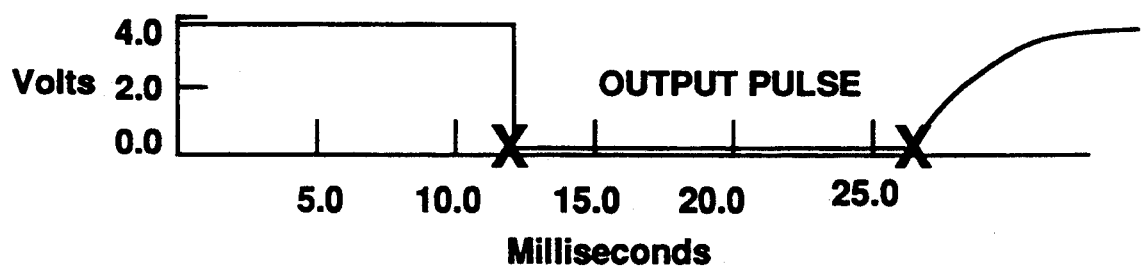

FIGS. 3a and 3b show a first example of operation of the circuit of FIG. 2 with a specific metering pulse generator that generates a single-lobe pulse. FIG. 3a is a graph of the input voltage received from bridge 13 as a function of time. FIG. 3b is a graph of the output voltage from the relay U1 as a function of time. The first "X" in FIGS. 3a and 3b illustrates the point at which the capacitors C1 and C2 become sufficiently charged to turn on transistor Q1. This turns on Q3 and starts the output pulse from the relay U1. The output pulse continues to the second "X" where C3 becomes sufficiently charged to turn on Q2. This in turn causes Q3 to turn off, which terminates the output pulse.

Figure 4A:
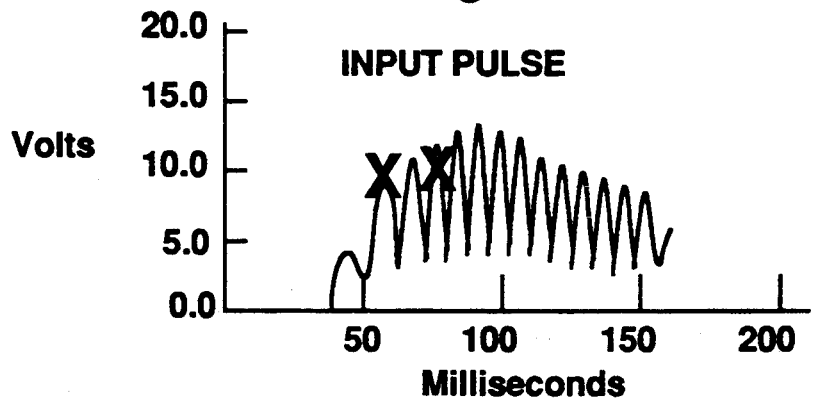
FIGS. 4a and 4b are graphs of voltage vs. time for the operation of FIG. 2 with a second metering pulse generator.
Figure 4B:
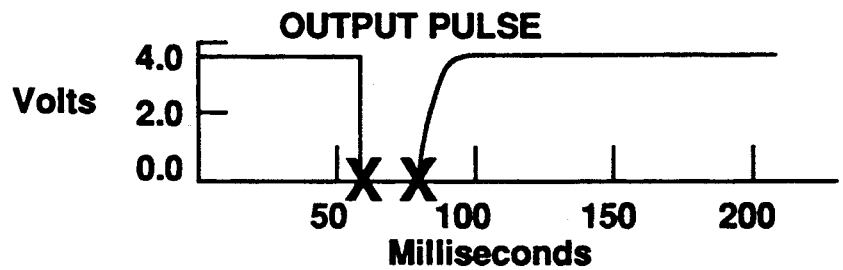

FIGS. 4a and 4b show a second example of operation of the circuit of FIG. 2 with a specific metering pulse generator which generates a pulse with a plurality of lobes at a given frequency. FIG. 4a is a graph of the input voltage received from bridge 13 as a function of time. FIG. 4b is a graph of the output voltage from the relay U1 as a function of time. The first "X" FIGS. 4a and 4b illustrates the point at which the capacitors C1 and C2 become sufficiently charged by several cycles of the input signal to turn on transistor Q1. This turns on Q3 and starts the output pulse from the relay U1. The output pulse continues to the second "X" where C3 becomes sufficiently charged to turn on Q2. This in turn causes Q3 to turn off, which terminates the output pulse. It should be noted that the length of the time of the output pulse in FIG. 3b between the "X's" is the same as the length of the time of the output pulse between the "X's" in FIG. 4b. Thus, an output pulse of the same duration is generated in response to different input pulses.

When Q2 is turned "on" to end the output pulse, C3 maintains the "on" state of transistor Q2 until after the completion of the generator pulse. The continuing "on" state of Q2 provides immunity from secondary lobes of the generator pulse seen in FIG. 4a, such that only one output pulse is produced even though the input signal contains a plurality of cycles.

This has been a description of an of how the invention can be carried out. Those of ordinary skill in the art will recognize that various details may be modified in arriving at other detailed embodiments, and these embodiments will come within the scope of the invention.

Therefore, to apprise the public of the scope of the invention and the embodiments covered by the invention, the following claims are made.

We claim:

1. Apparatus for interfacing a metering pulse generator to a pulse counter, the apparatus comprising:

inputs for connection to receive a sinusoidal waveform with one or more lobes from the metering pulse generator;

outputs for transmitting an output pulse to the pulse counter;

a charging circuit connected across the inputs to receive, and be charged by, the sinusoidal waveform from the metering pulse generator;

a solid state switch responsive to accumulated charge in the charging circuit to switch from an "off" state to an "on" state; and a logic pulse generator connected between the solid state switch and the outputs, for physical and electrical isolation of the metering pulse generator from the pulse counter, the logic pulse generator being operable in response to the "on" state of the solid state switch to generate said output pulse as a logic pulse through the outputs to the pulse counter.

2. The apparatus of claim 1, further comprising a delay circuit connected across the charging circuit to allow an accumulation of charge in the charging circuit for producing said output pulse as a pulse of suitable magnitude and duration in response to sinusoidal waveforms from different pulse generator units.

3. The apparatus of claim 1, further comprising a timing circuit connected between the solid state switch and the logic pulse generator, the timing circuit determining the duration of said output pulse and providing a delay before the logic pulse generator can respond to another sinusoidal waveform.

4. The apparatus of claim 1, further comprising a full wave rectifier connected across the inputs for processing signals irrespective of polarity.

5. The apparatus of claim 1, further comprising a transmitter coupled to the pulse counter for transmitting meter data to a utility control center.

6. The apparatus of claim 1, wherein the logic pulse generator is a solid state relay.

7. The apparatus of claim 1, further comprising a resistor connected across an output of the logic pulse generator to provide an analog lead line supervision measurement between the apparatus and automatic meter reading equipment which includes said pulse counter.

8. The apparatus of claim 1, further comprising a diode connected across an output of the logic pulse generator to provide a digital lead line supervision response between the apparatus and automatic meter reading equipment which includes said pulse counter.

* * * * *

UNITED STATES PATENT AND TRADEMARK OFFICE
CERTIFICATE OF CORRECTION

PATENT NO. : 5,451,937

DATED : September 19, 1995

INVENTOR(S) : John A. Olson, et al.

It is certified that error appears in the above-identified patent and that said Letters Patent is hereby corrected as shown below:

Col. 4, line 11    After "X" the word --in-- should be inserted.

Col. 4, line 33    After "description of" the words "of an" should be deleted.

Signed and Sealed this

Twelfth Day of March, 1996

*Attest:*

BRUCE LEHMAN

*Attesting Officer*    Commissioner of Patents and Trademarks